United States Patent
Li

(10) Patent No.: US 9,198,304 B2
(45) Date of Patent: Nov. 24, 2015

(54) METHOD FOR MANUFACTURING RIGID-FLEXIBLE PRINTED CIRCUIT BOARD

(75) Inventor: Biao Li, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 899 days.

(21) Appl. No.: 13/441,932

(22) Filed: Apr. 9, 2012

(65) Prior Publication Data

US 2012/0260501 A1    Oct. 18, 2012

(30) Foreign Application Priority Data

Apr. 13, 2011    (CN) .......................... 2011 1 0092237

(51) Int. Cl.
*H05K 3/02* (2006.01)
*H05K 3/10* (2006.01)
*H05K 3/46* (2006.01)

(52) U.S. Cl.
CPC ...... *H05K 3/4691* (2013.01); *H05K 2201/0715* (2013.01); *H05K 2201/0909* (2013.01); *H05K 2201/09127* (2013.01); *H05K 2203/308* (2013.01); *Y10T 29/49155* (2015.01)

(58) Field of Classification Search
CPC ... H05K 3/4691; H05K 3/4697; H05K 1/183; H05K 2201/0715; H05K 2201/09127; H05K 2203/308; H05K 2201/0909; Y10T 29/49155
USPC ............ 29/830, 831, 846, 847, 852; 156/248, 156/250, 252; 174/254; 216/17; 427/97.2
See application file for complete search history.

(56) References Cited

U.S. PATENT DOCUMENTS

| 4,338,149 A * | 7/1982 | Quaschner ...................... 29/831 |
| 4,931,134 A * | 6/1990 | Hatkevitz et al. ............... 29/846 |
| 5,499,444 A * | 3/1996 | Doane et al. .................... 29/830 |
| 8,071,883 B2 * | 12/2011 | Takahashi et al. ............ 174/254 |

* cited by examiner

*Primary Examiner* — Donghai D Nguyen
(74) *Attorney, Agent, or Firm* — Novak Druce Connolly Bove + Quigg LLP

(57) ABSTRACT

A method for manufacturing a rigid-flexible printed circuit board includes following steps. First, a flexible PCB is provided. The flexible PCB includes a base and an electrical trace layer on the base. The flexible PCB includes a first region and a second region connected to the first region. The first and second regions define a borderline. Second, a protective film and a peelable layer are sequentially formed on the electrical trace layer in the first region and part of the second region. Third, a copper coil, an adhesive tape and the flexible circuit board are laminated together. Fourth, the copper coil in the second region is etched to form an outer electrical trace layer. Last, the copper coil in the first region is removed and the peelable layer and the adhesive tape are peeled off, thereby obtaining an R-F PCB.

18 Claims, 13 Drawing Sheets

METHOD FOR MANUFACTURING RIGID-FLEXIBLE PRINTED CIRCUIT BOARD

BACKGROUND

1. Technical Field

The present disclosure relates to printed circuit boards, particularly to a method for manufacturing a rigid-flexible printed circuit board.

2. Description of Related Art

Rigid-flexible printed circuit boards (R-F PCBs) are widely used in electronic devices. The R-F PCB has a rigid portion and a flexible portion. The rigid portion is configured for assembling electronic components and maintaining electrical connections among the electronic components. The flexible portion is connected to the rigid portion and can be bent relative to the rigid portion. Thus, a large number of electronic components can be assembled on the rigid portion of the rigid flexible printed circuit board without occupying a large amount of space.

A typical method for manufacturing an R-F PCB is described as follows. First, a flexible printed circuit board (FPCB) is manufactured. Second, a rigid printed circuit board (R-PCB) is laminated on the FPCB, and copper conductive tracks are formed on the R-PCB. Third, an opening is formed in a region of the R-PCB for exposing part of the FPCB, thereby forming a flexible portion. Other parts of the FPCB and the corresponding R-PCB form a rigid portion. Thus, an R-F PCB having a flexible portion and a rigid portion is obtained. Before forming the R-PCB, a coating layer and a peelable binder layer is sequentially laminated on the FPCB in the flexible portion. Sometimes, an electro-magnetic shielding layer and another coating layer are formed between the coating layer and the peelable binder layer in the flexible portion. When the R-PCB is laminated on the FPCB, these additional layers in the flexible portion will cause the thickness of the flexible portion to be much greater than that of the rigid portion. In a following a step, solder-resistant materials are printed on the R-PCB, and then the solder-resistant materials are exposed and developed to form a solder-resistant layer for protecting an electrical trace layer on the R-PCB. The differences between the flexible portion and the rigid portion may cause a photo mask used in the exposure step to not entirely contact the surface of the rigid printed circuit board in the rigid portion. This will reduce the quality of the R-F PCB.

What is needed, therefore, is a method for manufacturing a rigid-flexible printed circuit board, to overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
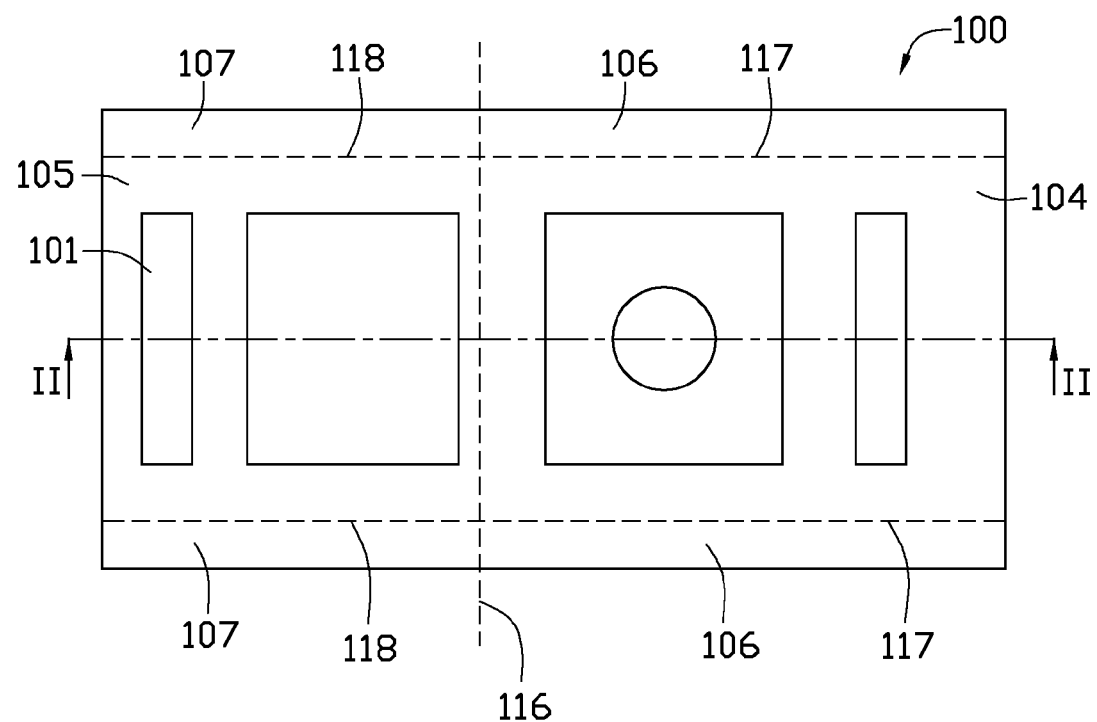
FIG. 1 is a schematic, front view of a flexible substrate an exemplary embodiment.
Figure 2:
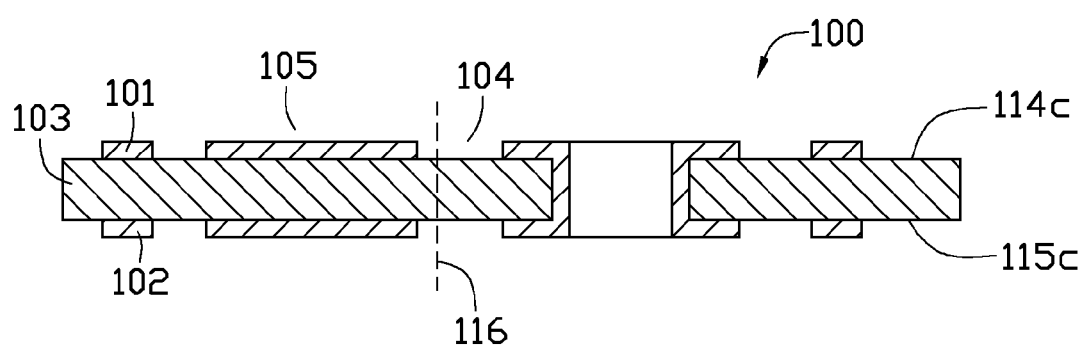
FIG. 2 is a schematic, cross-sectional view of FIG. 1, showing a structure of the flexible substrate.

A method of manufacturing a R-F PCB according to an embodiment will now be described in detail below with reference to the drawings FIGS. 1 and 2, show in step 1, a flexible substrate 100 with electrical trace layers is provided.

In this embodiment, the flexible substrate 100 is a double-sided board. The flexible substrate 100 includes a base 103, a first electrical trace layer 101 and a second electrical trace layer 102. The base 103 may be a single layer structure of dielectric resin, or a multilayer structure comprising a plurality of the mentioned single layer and a plurality of conductive layers. The base 103 is an insulation material, and can be selected from the group consisting of polyimide (PI), Teflon, polyamide, polymethylmethacrylate, polycarbonate, polyethylene terephtalate (PET), polyamide polyethylene-terephthalate copolymer or any combination thereof. The base 103 has a first surface 114 and an opposite second surface 115. The first electrical trace layer 101 is formed on the first surface 114, and the second electrical trace layer 102 is formed on the second surface 115. The flexible substrate 100 includes a first region 104 and a second region 105 connected to each other. The first region 104 and the second region 105 define a first borderline 116, as shown in FIGS. 1 and 2. The first region 104 finally forms a flexible portion (see the flexible portion 18 in FIG. 11) of an R-F PCB. The second region 105 is fixed with a rigid substrate in following steps, thereby forming a rigid portion (see the rigid portion 20 in FIG. 13) of an R-F PCB. The first electrical trace layer 101 and the second electrical trace layer 102 are arranged in both of the first region 104 and the second region 105. The flexible substrate 100 further includes a first peripheral unwanted portion 106 at two opposite sides of the first region 104, and a second peripheral unwanted portion 107 at two opposite sides of the second region 105. The first peripheral unwanted portion 106 and the first region 104 define imaginary borderlines 117 substantially perpendicular to the first borderline 116, as shown in FIG. 1. The second peripheral unwanted portion 107 and the second region 105 define imaginary borderlines 118 substantially perpendicular to the first borderline 116, as shown in FIG. 1. The first and second peripheral unwanted portions 106 and 107 are sacrificial portion, and are configured for supporting/reinforcing the first and second regions 104 and 105 and will be removed in a later step.

Figure 3:
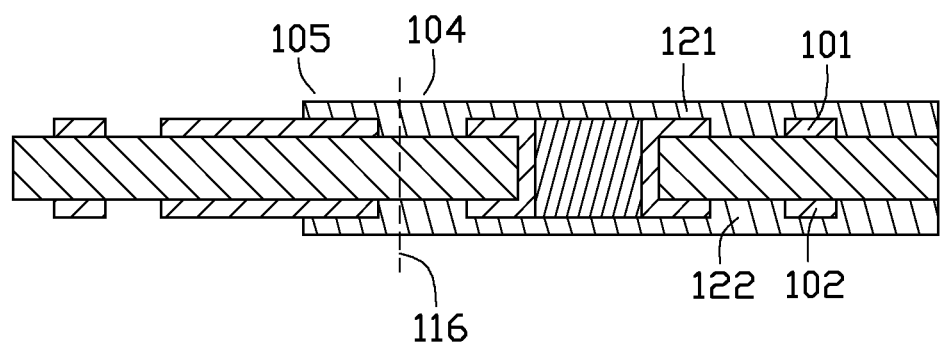
FIG. 3 is similar to FIG. 2, but showing a flexible portion of the flexible substrate laminated by a first protective film and a second protective film.

FIG. 3, in step 2, shows a first protective film 121 is formed on the first electrical trace layer 101 in the entire first region 104 and part of the second region 105 adjacent to the first region 104. In addition, a second protective film 122 is formed on the second electrical trace layer 102 in the entire first region 104 and part of the second region 105.

The first protective film 121 covers the first surface 114 in the entire first region 104 and part of the second region 105 adjacent to the first region 104. The first protective film 121 protects the first electrical trace layer 101 in the first region 104. The second protective film 122 covers the second surface 114 in the entire first region 104 and part of the second region 105 adjacent to the first region 104. The second protective film 122 protects the second electrical trace layer 102 in the first region 104.

Figure 4:
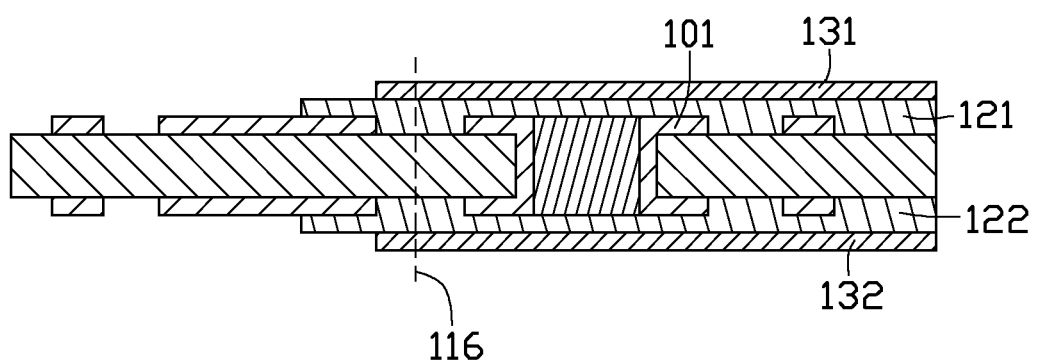
FIG. 4 is similar to FIG. 3, but showing each of the first protective film and the second protective film covered by a silver film, thereby forming a first electro-magnetic shielding layer on the first protective film and a second electro-magnetic shielding layer on the second protective film.
Figure 5:
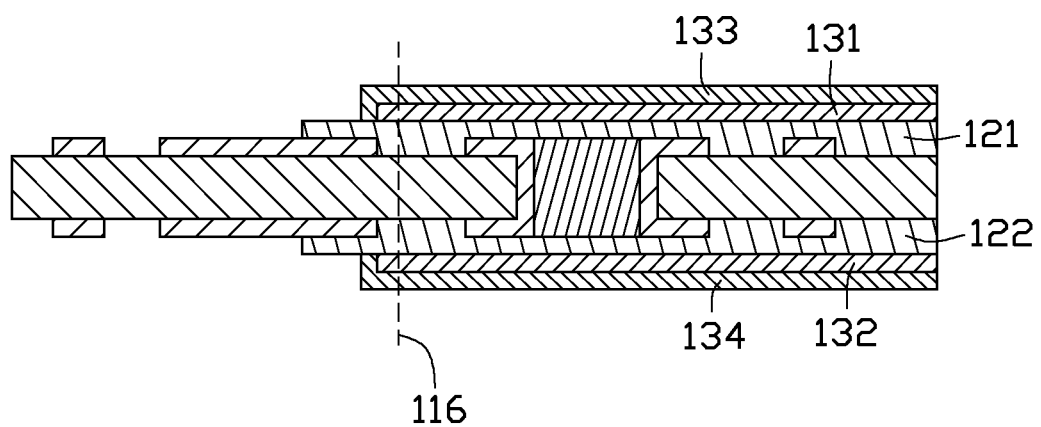
FIG. 5 is similar to FIG. 4, but showing a third coating layer laminating on the first electro-magnetic shielding layer, and a fourth coating layer laminating on the second electro-magnetic shielding layer.

FIGS. 4 and 5, show in step 3, a first shielding layer 131 is formed on the first protective film 121 and a second shielding layer 132 is formed on the second protective film 122. Then a third protective film 133 is formed on the first shielding layer 131 and a fourth protective film 134 is formed on the second shielding layer 132.

The first and second shielding layers 131 and 132 protect the FPCB 100 from electromagnetic interference and static charges. In this embodiment, the first and second shielding layers 131 and 132 are formed by screen printing conductive silver paste on the first and second coating layers 121 and 122. The first shielding layer 131 covers the first protective film 121 in the entire first region 104 and part of the second region 105 adjacent to the first region 104. In the second region 105, the first shielding layer 131 covers part of the first protective film 121 adjacent to the first region 104. An edge of the first shielding layer 131 in the second region 105 is closer to the borderline 116 than that of the first coating layer 121. In this embodiment, the first shielding layer 131 has a mesh grid structure, thereby having high flexibility. The second shielding layer 132 covers the second protective film 122 in the entire first region 104 and part of the second region 105 adjacent to the first region 104. In the second region 105, the second shielding layer 132 covers part of the second protective film 122 adjacent to the first region 104. An edge of the second shielding layer 132 in the second region 105 is closer to the borderline 116 than that of the second coating layer 122. In this embodiment, the second shielding layer 132 has a mesh grid structure, thereby having high flexibility.

The third coating layer 133 protects the first shielding layer 131. The third coating layer 133 has an area greater than that of the first shielding layer 131 and less than that of the first coating layer 121. Therefore, the third coating layer 133 covers all the first shielding layer 131, and part of the first coating layer 121 is exposed. The fourth coating layer 134 protects the second shielding layer 132. The fourth coating layer 134 has an area greater than that of the second shielding layer 132 and less than that of the second coating layer 122. Therefore, the fourth coating layer 134 covers all the second shielding layer 132, and part of the second coating layer 122 is exposed.

In other embodiments, the first and second shielding layers 131 and 132, and the third and fourth coating layers 133 and 134 can be omitted.

Figure 6:
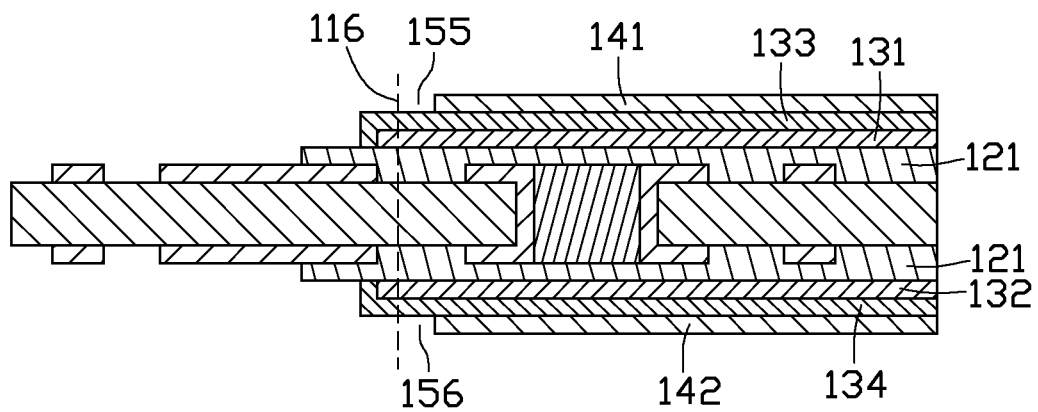
FIG. 6 is similar to FIG. 5, but showing a first peelable binder layer laminating on the third protective film, and a second peelable binder layer laminating on the fourth protective film.

FIG. 6, in step 4, shows a first peelable layer 141 formed on the third coating layer 133, and a second peelable layer 142 formed on the fourth coating layer 134.

The first peelable layer 141 is arranged on the third coating layer 133 in the first region 104. A first gap 155 is formed between the first peelable layer 141 and the borderline 116. In this embodiment, the first gap 155 has a width of 10 mils. The first gap 155 will be filled with an adhesive in a later step. The second peelable layer 142 is arranged on the fourth coating layer 134 in the first region 104. A second gap 156 is formed between the second peelable layer 142 and the borderline 116. In this embodiment, the second gap 156 has a width of 10 mils. The second gap 156 will be filled with an adhesive in a later step. In this embodiment, each of the first and second peelable layers 141 and 142 is a peelable adhesive tape. Generally, the peelable adhesive tape comprises a release film, an isolating film and an adhesive layer sandwiched between the release film and the isolating film. When using the peelable adhesive tape, the release film is removed, the adhesive layer is attached to the third coating layer 133 or the fourth coating layer 134, and the isolating film is exposed. The isolating film can be comprised of a material, which can withstand acid alkalis, high temperature, and high pressure.

Each of the first and second peelable layers 141 and 142 can also be formed by printing peelable ink. The peelable ink can be a heat-cured ink, such as an ink consisting of Thermoplastic Polyurethanes (TPU), Dipropylene Glycol, Monomethyl Ether, Butylcellosolve, $TiO_2$ and mold release agent. After printing, the peelable ink should be baked for curing, thereby forming the peelable layers 141 and 142.

Figure 7:
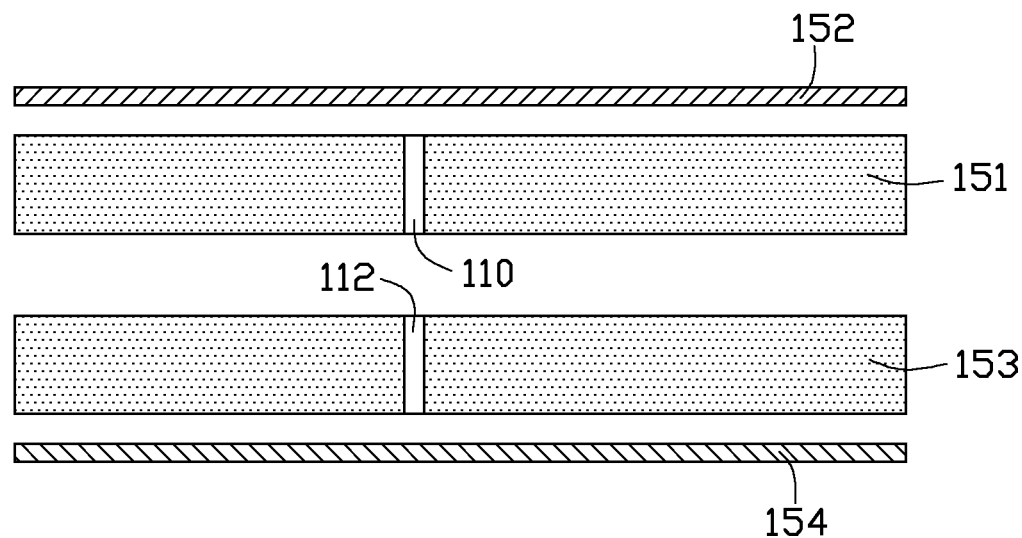
FIG. 7 is a schematic, cross-sectional view of a first base, a second base, a first copper foil, and a second copper foil.

FIG. 7, in step 5, shows a first adhesive tape 151, a first copper coil 152, a second adhesive tape 153 and a second copper coil 154 are provided. The first adhesive tape 151 defines a first slot 110 running through two opposite surfaces of the first adhesive tape 151. The second adhesive tape 153 defines a second slot 112 running through two opposite surfaces of the second adhesive tape 153.

The first and second adhesive tapes 151 and 153 can be a self-adhesive sheet of pre-preg, consisting of epoxy resin and glass fiber. The first and second slots 110 and 112 are defined by using a laser to cut the first and second adhesive tapes 151 and 153. The first slot 151 has a width less than that of the first gap 155, and the second slot 153 has a width less than that of the second gap 156. In this embodiment, the first and second slots 151 and 153 have an equal width of 5 mils.

Figure 8:
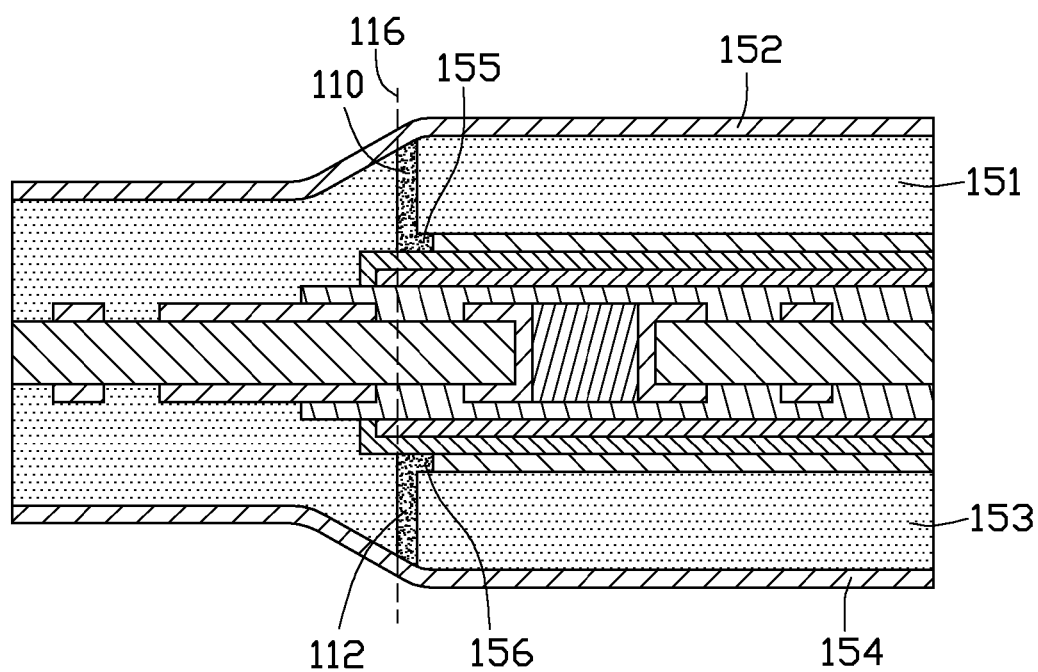
FIG. 8 shows a lamination structure of the FPCB of FIG. 6 and the first base, the second base, the first copper foil and a second copper foil of FIG. 7.

Referring to FIG. 8, in step 6, the first copper coil 152, the first adhesive tape 151, the FPCB 100, the second adhesive tape 153, and the second copper coil 154 are sequentially laminated together in the above order. An internal edge of the first slot 110 is aligned along the borderline 116, and the first slot 110 is in communication with the first gap 155. An internal edge of the second slot 112 is aligned along in the borderline 116, and the second slot 112 is in communication with the second gap 156.

When laminating, the first adhesive tape 151 and the second adhesive tape 153 are also heated. The materials of the first adhesive tapes 151 are softened and flow to the first slot 110 and the first gap 155, and the second and 153 are softened and flow to the second slot 112 and the second gap 156.

Figure 9:
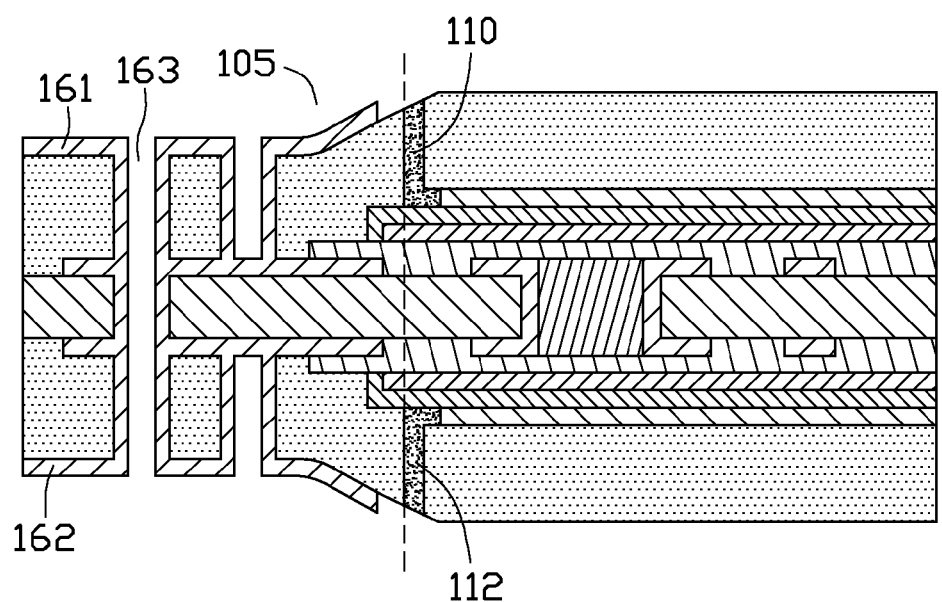
FIG. 9 is similar to FIG. 8, but showing a lamination structure after forming holes, electroplating and forming electrical trace layers.

Referring to FIG. 9, in step 7, the second region is drilled to form a through hole, and then electrically conductive material, such as copper, is deposited at an inner wall of the through hole, thereby forming a plated through hole 163. The first copper coil 152 in all the first region 104 is removed, and part of the first copper coil 152 in the second region 105 is removed, thereby forming a first outer electrical trace layer 161. The second copper coil 154 in all the first region 104 is removed, and part of the second copper coil 154 in the second region 105 is removed, thereby forming a second outer electrical trace layer 162. The plated through hole 163 electrically connects the first outer electrical trace layer 161, the first electrical trace layer 101, the second electrical trace layer 102, and the second outer electrical trace layer 162.

The first and second outer electrical trace layers 161 and 162 can be formed by etching the first and second copper coils 152 and 154. In this etching process, the first and second copper coils 152 and 154 in the first region 104 are totally removed. Except for the first and second coils 152 and 154 aligned with the first and second slots 110 and 112, the first and second coils 152 and 154 in the first region can also remain.

Figure 10:
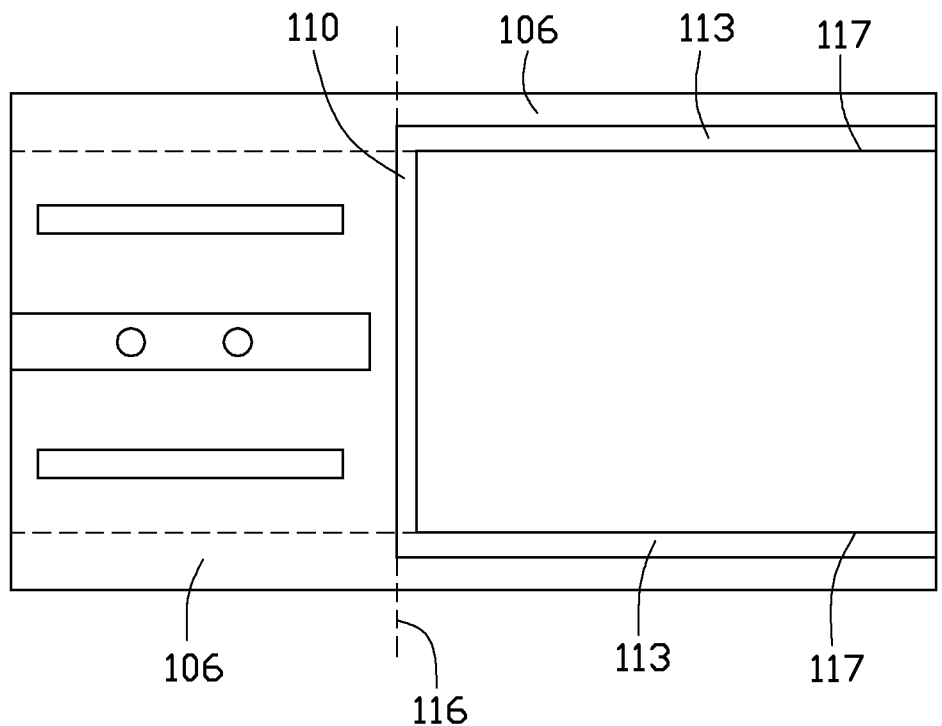
FIG. 10 is a schematic, front view of FIG. 9, but showing a laser abrasion on the lamination structure of FIG. 9.

FIG. 10, show in step 8, two third slots 113 communicating with the first slot 110 are formed along the boundaries 106 and through the first adhesive tape 151 using a laser beam. Thus, the first slot 110 and the third slots 113 surround the first region 104. Two fourth slots (not shown) communicating with the second slot 112 are formed along the boundaries 106 and through the second adhesive tape 153 using a laser beam. Thus, the second slot 112 and the fourth slots surround the first region 104.

Figure 11:
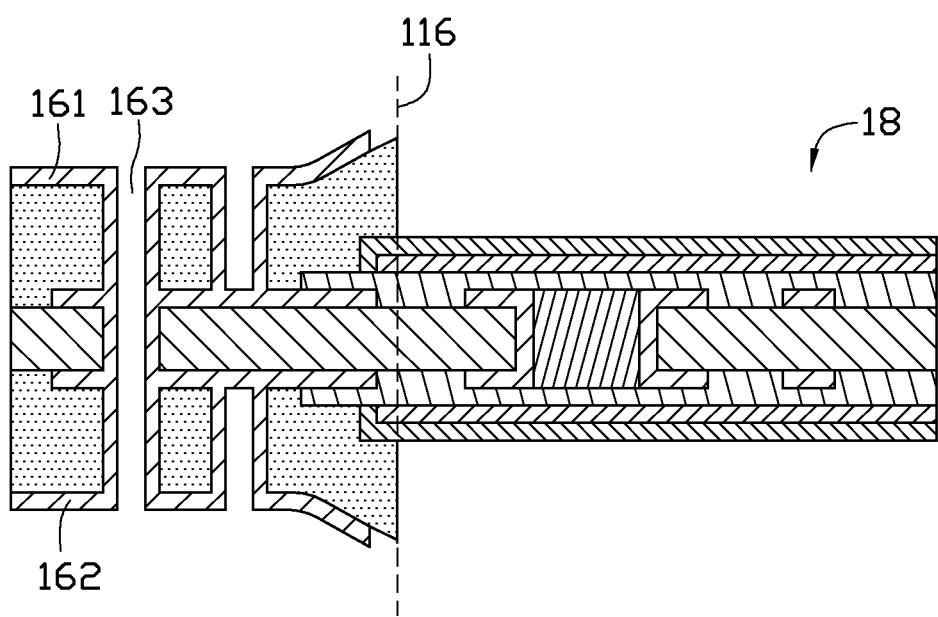
FIG. 11 is similar to FIG. 9, but showing the first peelable binder layer and the second peelable binder layer peel off from the flexible portion.

FIG. 11, shows in step 9, the first peelable layer 141, the third protective film 133 and the first adhesive tape 151 in the first region 104 peel off from the first slot 110 and the third slots 113. The second peelable layer 142, the fourth protective film 134, and the second adhesive tape 153 in the first region 104 are peeled off from the second slot 112 and the fourth slots.

The first and second peelable layers 141 and 142 can be easily peeled because of the first, second, third slots 110, 112, 113, and the fourth slots. These layers may be peeled manually or may be peeled by auxiliary machinery. After this step, a flexible portion 18 of an R-F PCB is formed in the first region 104.

Figure 12:
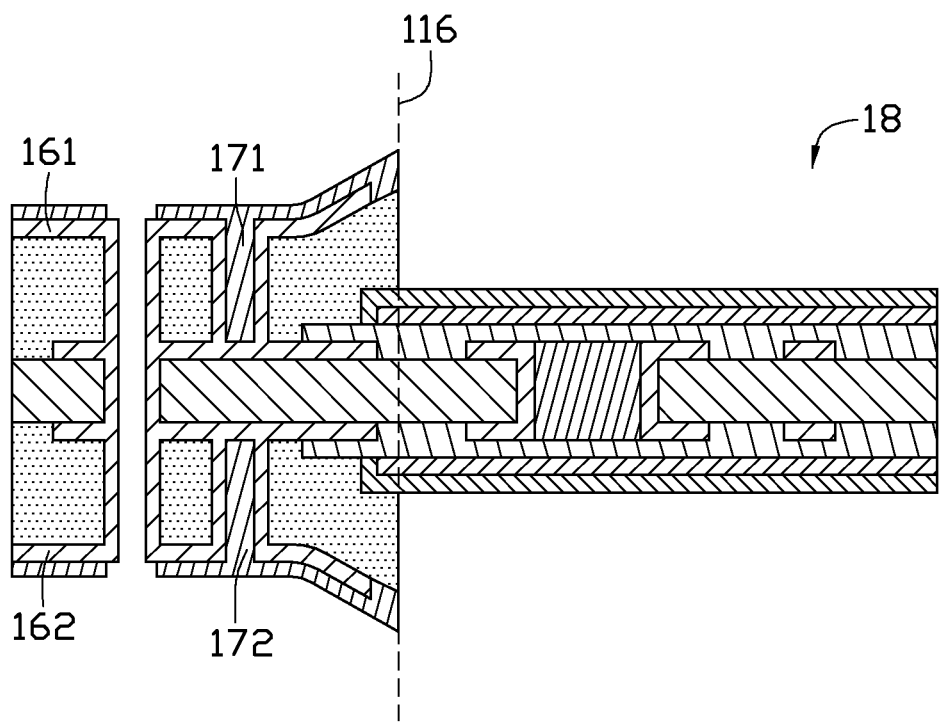
FIG. 12 is similar to FIG. 10, but showing a semi-finished PCB after forming solder-resistant layers on the lamination structure of FIG. 11.

Referring to FIG. 12, in step 10, a first solder-resistant layer 171 is formed on the first outer electrical trace layer 161, and a second solder-resistant layer 172 is formed on the second outer electrical trace layer 162.

Solder-resistant materials are printed on the first and second electrical trace layers 161, and then are exposed and developed, thereby obtaining the first and second solder-resistant layers 171 and 172. Some portions of the first and second outer electrical trace layers 161 and 162 are exposed for mounting electronic components. Because the first peelable layer 141, the second peelable layer 142, the first adhesive tape 151, the second adhesive tape 153, the first copper coil 152, and the second copper coil 154 in the first region 104 are removed before forming the first solder-resistant layer 171. The thickness is thereby reduced between PCB in the first region 104 and the PCB in the second region 105. Thus, photo masks used in the exposure process can contact the entire surface of the first and second outer electrical trace layers 161 and 162.

Figure 13:
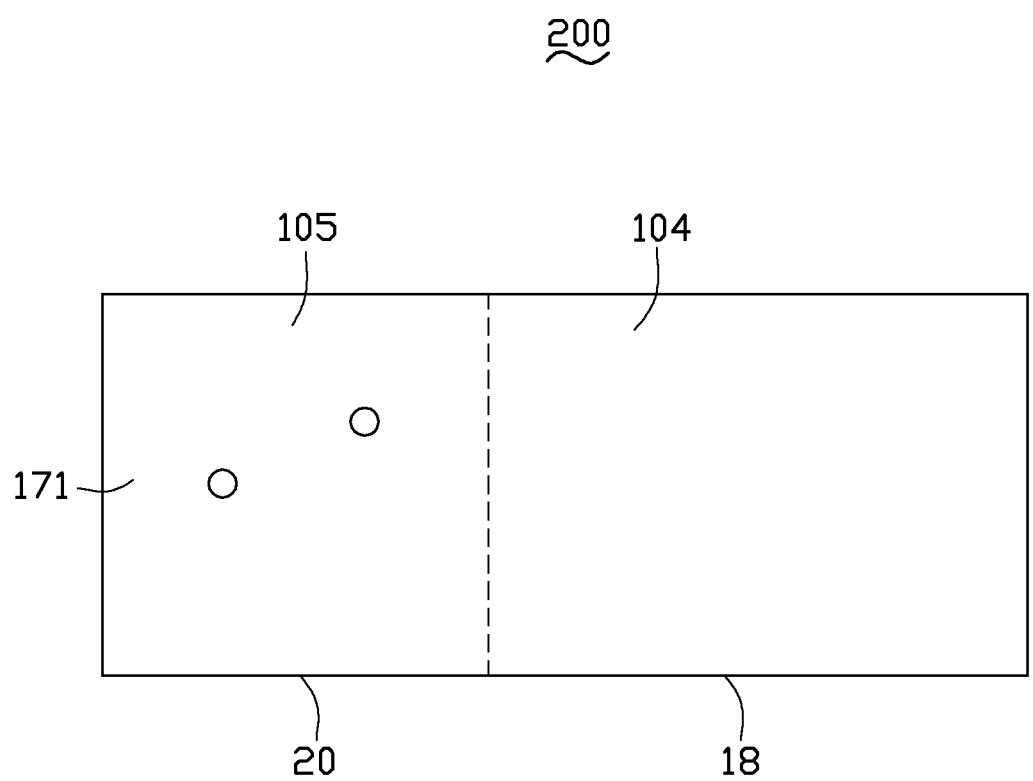
FIG. 13 is schematic, front view of an R-F PCB after routing a shape of the semi-finished PCB of FIG. 12.

FIG. 13, shows in step 11, the first peripheral unwanted portion 106 is separated from the first region 104 by cutting along the borderline 117, and the peripheral unwanted portion 107 is separated from the second region 105 by cutting along the borderline 118, thereby obtaining a R-F PCB 200. The R-F PCB 200 in the first region 104 is the flexible portion 18. The R-F PCB 200 in the second region 105 is a rigid portion 20.

The adhesive tape and the outer electrical trace layer can be formed just on one side of the FPCB, and the opposite side of the FPCB is not covered by the adhesive tape and the outer electrical trace layer. In addition, the rigid portion can surround the flexible portion. The R-F PCB can include two rigid portions and a flexible portion, and the flexible portion is interconnected between the two rigid portions.

While certain embodiments have been described and exemplified above, various other embodiments will be apparent to those skilled in the art from the foregoing disclosure. The present disclosure is not limited to the particular embodiments described and exemplified but is capable of considerable variation and modification without departure from the scope of the appended claims.

What is claimed is:

1. A method for manufacturing a rigid-flexible printed circuit board, comprising:

providing a flexible printed circuit board comprising an insulation base and a first electrical trace layer formed on a first surface of the insulation base, the flexible printed circuit board comprising a first region, a second region connected to the first region, a first peripheral unwanted portion connected to the first region, and a second peripheral unwanted portion connected to the second region, the first region and second region defining a first borderline therebetween, the first region and the first peripheral unwanted portion defining a second borderline therebetween substantially perpendicular to the first borderline, the second region and the second peripheral unwanted portion defining a third borderline therebetween substantially perpendicular to the first borderline;

forming a first protective film on the first electrical trace layer over the first region and part of the second region adjacent to the first region;

forming a first peelable layer on the first protective film in the first region;

providing a first adhesive tape and a first copper coil, the first adhesive tape defining a first slot corresponding to the first borderline;

laminating the first copper coil, the first adhesive tape and the flexible circuit board together, an internal edge of the first slot being aligned along the first borderline, the first slot arranged within the first region;

etching part of the first copper coil in the second region to form a first outer electrical trace layer, and removing the first copper coil in the first region;

forming a second slot through the first adhesive tape along the second borderline, the second slot being in communication with the first slot;

peeling off the first peelable layer and the first adhesive tape along the first slot and the second slot; and removing the first peripheral unwanted portion and the second peripheral unwanted portion along the second borderline and the third borderline to obtain a rigid-flexible printed circuit board, the rigid-flexible printed circuit board in the first region being a flexible portion, and the rigid-flexible printed circuit board in the second region being a rigid portion.

2. The method of claim 1, further comprising a step of forming a shielding layer between the first protective film and the first peelable layer, the first shielding layer covering the entire first region and part of the second region, and the first shielding layer in the second region having an area less than that of the first protective film, the first shielding layer being configured for preventing from electromagnetic interference and static charges.

3. The method of claim 2, wherein the first shielding layer is formed by screen printing conductive silver paste on the first protective film, and the first shielding layer has a mesh grid structure.

4. The method of claim 2, further comprising a step of forming a second protective film between the first shielding layer and the first peelable layer, the second protective film having an area greater than that of the first shielding layer and less than that of the first protective film, the second protective film covering the entire first shielding layer and exposing part of the first protective film.

5. The method of claim 4, wherein the first peelable layer contacts the second protective film, a first gap being defined between the first peelable layer and the first borderline.

6. The method of claim 5, wherein the first slot is in communication with the first gap during the step of laminating the first copper coil, the first adhesive tape and the flexible circuit board, after the laminating step, the first slot and the first gap are filled with materials of the first adhesive tape.

7. The method of claim 1, wherein the first peelable layer is a peelable adhesive tape comprising an adhesive layer attached on the first protective film and an isolating film on the adhesive layer.

8. The method of claim 1, wherein the first peelable layer is formed by printing peelable ink, and then baking the peelable ink.

9. The method of claim 1, further comprising a step of forming a plated through hole before forming the first outer electrical trace layer.

10. A method for manufacturing a rigid-flexible printed circuit board, comprising:
  providing a flexible printed circuit board comprising an insulation base, a first electrical trace layer formed on a first surface of the insulation base and a second electrical trace layer formed on an opposite second surface of the insulation base, the flexible printed circuit board comprising a first region, a second region connected to the first region, a first peripheral unwanted portion connected to the first region, and a second peripheral unwanted portion connected to the second region, the first region and second region defining a first borderline, the first region and the first peripheral unwanted portion defining a second borderline intersecting the first borderline, the second region and the second peripheral unwanted portion defining a third borderline intersecting the first borderline;
  forming a first protective film on the first electrical trace layer in the first region and part of the second region adjacent to the first region, and a second protective film on the second electrical trace layer in the first region and part of the second region adjacent to the first region;
  forming a first peelable layer on the first protective film in the first region, and a second second peelable layer on the second protective film in the first region;
  providing a first adhesive tape, a first copper coil, a second adhesive tape and a second copper coil, the first adhesive tape defining a first slot corresponding to the first borderline, the second adhesive tape defining a second slot corresponding to the first borderline;
  laminating the first copper coil, the first adhesive tape, the flexible circuit board, the second adhesive tape and the second copper coil together, an internal edge of the first slot being arranged along the first borderline and the first slot arranged inside the first region, an internal edge of the second slot being arranged along the first borderline, the second slot arranged inside the first region;
  etching part of the first copper coil in the second region to form a first outer electrical trace layer, and removing the first copper coil in the first region, and etching part of the second copper coil in the second region to form a second outer electrical trace layer, and removing the second copper coil in the first region;
  forming a third slot through the first adhesive tape along the second borderline, and a fourth slot through the second adhesive tape along the second borderline, the third slot being in communication with the first slot, and the fourth slot being in communication with the second slot;
  peeling off the first peelable layer and the first adhesive tape along the first slot and the third slot, and peeling off the second peelable layer and the second adhesive tape along the second slot and the fourth slot; and
  removing the first peripheral unwanted portion and the second peripheral unwanted portion along the second borderline and the third borderline to obtain a rigid-flexible printed circuit board, the rigid-flexible printed circuit board in the first region being a flexible portion, and the rigid-flexible printed circuit board in the second region being a rigid portion.

11. The method of claim 10, further comprising a step of forming a first shielding layer between the first protective film and the first peelable layer, and a second shielding layer between the second protective film and the second peelable layer, the first shielding layer covering the entire first region and part of the second region, and the first shielding layer in the second region having an area less than that of the first protective film, the second shielding layer covering the entire first region and part of the second region, and the second shielding layer in the second region having an area less than that of the second protective film, the first and second shielding layers being configured for preventing from electromagnetic interference and static charges.

12. The method of claim 11, wherein the first shielding layer is formed by screen printing conductive silver paste on the first protective film, the second shielding layer is formed by printing silver screen printing conductive silver paste on the second protective film, and each of the first and second shielding layers has a mesh grid structure.

13. The method of claim 11, further comprising a step of forming a third protective film between the first shielding layer and the first peelable layer, and a fourth protective film between the second shielding layer and the second peelable layer, the third protective film having an area greater than that of the first shielding layer and less than that of the first protective film, the third protective film covering the entire first shielding layer and exposing part of the first protective film, the fourth protective film having an area greater than that of the second shielding layer and less than that of the second protective film, the fourth protective film covering the entire second shielding layer and exposing part of the second protective film.

14. The method of claim 13, wherein the first peelable layer contacts the third protective film, a first gap being defined between the first peelable layer and the first borderline, the second peelable layer contacting the fourth protective film, a second gap being defined between the second peelable layer and the first borderline.

15. The method of claim 14, wherein the first slot is in communication with the first gap, and the second slot is in communication with the second gap during the step of laminating the first copper coil, the first adhesive tape, the flexible circuit board, the second adhesive tape and the second copper coil, after the laminating step, the first slot and the first gap being filled with materials of the first adhesive tape, and the second slot and the second gap are filled with materials of the second adhesive tape.

16. The method of claim 10, wherein the first peelable layer is a peelable adhesive tape comprising a first adhesive layer attached on the first protective film and a first isolating film on the first adhesive layer, and the second peelable layer is a peelable adhesive tape comprising a second adhesive layer attached on the third protective film and a second isolating film on the second adhesive layer.

17. The method of claim 10, wherein each of the first peelable layer and the second peelable layer is formed by printing peelable ink, and then baking the peelable ink.

18. The method of claim 10, further comprising a step of forming a plated through hole before forming the first and second outer electrical trace layers.

* * * * *